(12) United States Patent
Ho

(10) Patent No.: US 6,573,524 B2
(45) Date of Patent: Jun. 3, 2003

(54) METHOD OF ANALYZING DRAM REDUNDANCY REPAIR

(75) Inventor: Ming-Jing Ho, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/948,073

(22) Filed: Sep. 6, 2001

(65) Prior Publication Data

US 2003/0038257 A1 Feb. 27, 2003

(30) Foreign Application Priority Data

Aug. 24, 2001 (TW) ..................................... 90120813 A

(51) Int. Cl.$^7$ ............................................. G01N 21/88
(52) U.S. Cl. ................ 250/559.45; 382/149; 356/237.5
(58) Field of Search .......................... 356/237.2, 237.5; 382/144, 147, 149; 250/208.1, 208.2, 216, 559.45, 559.44, 559.43, 559.42; 711/104, 105

(56) References Cited

U.S. PATENT DOCUMENTS

| | | | | |
|---|---|---|---|---|
| 4,806,774 A | * | 2/1989 | Lin et al. ..................... | 250/550 |
| 5,428,442 A | * | 6/1995 | Lin et al. ..................... | 356/237 |
| 5,917,332 A | * | 6/1999 | Chen et al. .................. | 324/765 |

* cited by examiner

*Primary Examiner*—Stephone B. Allen
*Assistant Examiner*—Christopher W. Glass
(74) *Attorney, Agent, or Firm*—Charles C. H. Wu; Wu & Cheung, LLP

(57) ABSTRACT

A method of determining the correctness of a DRAM redundancy repair. The method is capable of detecting whether a redundancy repair has been properly conducted. The method includes illuminating a die on a wafer with a convergent light beam and observing the physical bit map produced after illumination on a screen. When the convergent light beam aims at a defective array, two semicircular shaped images appear on the screen. When the convergent light beam aims at a redundancy element used in a redundancy repair, a bright line appears on the screen. Through gauging the relative positions between the bright line and the pair of semicircular images, proper replacement by a redundancy element can be ascertained.

3 Claims, 4 Drawing Sheets

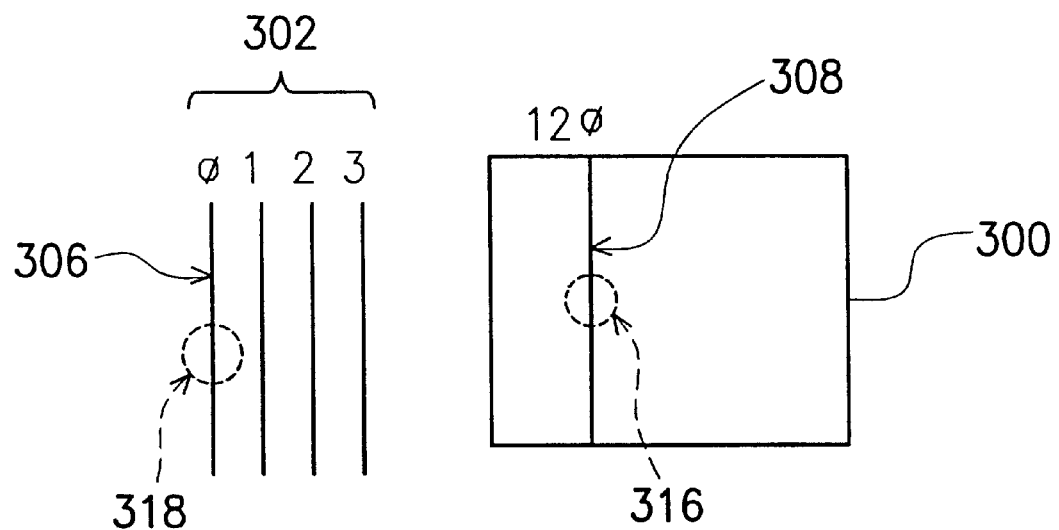
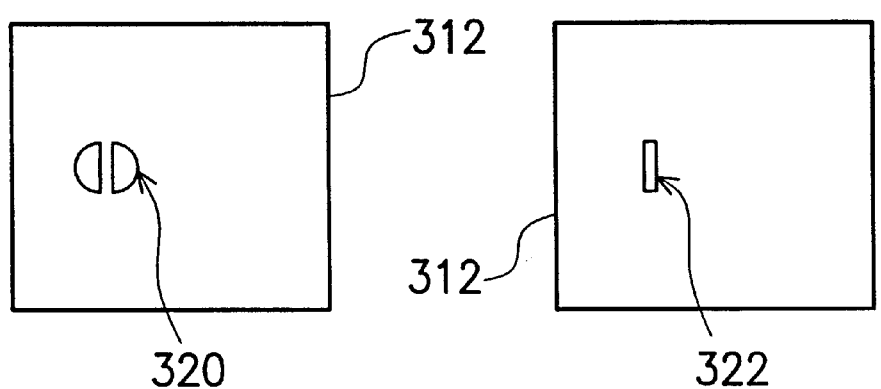
FIG. 4A
FIG. 4B  FIG. 4C

METHOD OF ANALYZING DRAM REDUNDANCY REPAIR

CROSS-REFERENCE TO RELATED APPLICATION

This application claims the priority benefit of Taiwan application serial no. 90120813, filed Aug. 24, 2001.

BACKGROUND OF THE INVENTION

1. Field of Invention

The present invention relates to a method of analyzing a dynamic random access memory (DRAM) function. More particularly, the present invention relates to a method of analyzing the correctness of a DRAM redundancy repair.

2. Description of Related Art

Aside from the elements necessary for performing normal dynamic random access memory (DRAM) functions, most arrays also have redundancy elements for repairing defects. This is because some defects are normally produced during the manufacturing process. The so-called 'redundancy' refers to a few more rows or columns on a die that have no particular function under the normal situation but can be connected to become an active circuit element should defects occur in the array. To provide a better explanation of the array on a die and the distribution of redundant elements, refer to FIGS. 1A and 1B.

FIG. 1A is a schematic diagram showing an array with redundant elements within a conventional dynamic random access memory die. As shown in FIG. 1A, the die includes a normal array 100 and some redundancy elements 102. After a wafer is designed, the circuit must be tested. If a defective array (the array 120) 104 appears within the array 100, a specified program is used to find the defect location before a redundancy repair is carried out.

FIG. 1B is a schematic diagram showing the array in FIG. 1A after a redundancy repair operation. As shown in FIG. 1B, a specific program has been used to find the location of the design defect and redundancy rules have been employed to organize data files. Redundancy repair is conducted according to the data within the files. In other words, an array (redundancy) 106 within the redundancy elements 102 will replace the defective array (array 120) 104 (refer to FIG. 1A). Ultimately, the defective array (array 120) 104 inside the normal array 100 is replaced by an effective array (array 12) 108.

Hence, redundancy repair is an important means of increasing yield and reducing the number of defects in the manufacturing of DRAM products. However, quite frequently, the DRAM still contains defects after a redundancy repair so that it is difficult to assess whether the circuit design is good or bad. Furthermore, after the repair, it is also quite difficult to ascertain if the defective portions have been properly repaired or the original correct array circuit has been replaced by redundancy elements without solving the defective problem. To ascertain correctness of the redundancy repair, a trial-and-error method is frequently used. In other words, DRAM cells must be repeatedly produced and tested. With repeated production and testing, production time and the number of manufacturing steps are increased.

In addition, to remove the difficulties of deciding whether a particular design is good or bad or whether a particular defect has been correctly repaired after a redundancy repair, a design in test mode is normally executed to inspect the already repaired redundancy data. Otherwise, a large quantity of data and repeated laser inspection need to be conducted. Moreover, the testing mode will increase area occupation of the die leading to a greater production cost.

SUMMARY OF THE INVENTION

Accordingly, one object of the present invention is to provide a method of analyzing the correctness of a DRAM redundancy repair. The method is capable of detecting the correctness of a circuit design and indicating whether a defective location is properly repaired or not after a redundancy repair. Ultimately, the manufacturing process is simplified, production time is saved and production cost is reduced.

A second object of this invention is to provide a device for analyzing the correctness of a DRAM redundancy repair. The device is capable of determining if a DRAM redundancy repair is correctly conducted so that production time is saved, manufacturing process is simplified and production cost is saved.

This invention utilizes the characteristics of a DRAM cell to test the correctness of a redundancy repair. The so-called characteristics of a DRAM device refers to the utilization of a convex lens between an automatic pin probe and a light source to focus a light source onto one portion of an area within the die as small as a point. When a particular DRAM cell is illuminated by the spot of light, leakage is intensified and a stored data bit within the DRAM cell having the value '1' is converted to a stored data '0' after some time. This is the so-called refresh time. Utilizing the refresh time test to fail the illuminated array element and to pass the non-illuminated array element, a physical bit map can be projected onto a computer screen.

This invention provides a method of analyzing the correctness of a DRAM redundancy repair. The method utilizes a convergent light beam to illuminate the dies on a wafer and then observes the physical bit map on a monitor after illumination. When the convergent light beam is made to align with the defect location on an array, the monitor will display two semicircular-shaped bright regions. On the other hand, when the convergent light beam is made to align with the redundancy location for conducting a repair, the monitor will display a bright line. According to the bright line and two semicircular-shaped bright regions, correctness of the redundancy repair can be determined.

This invention also provides a device for analyzing the correctness of a DRAM redundancy repair. The device includes an automatic pin probe, a light source and a convex lens. A die to be tested is placed on the automatic pin probe with the light source located directly above. Utilizing the convex lens between the automatic pin probe and the light source to focus the light from the light source onto the die, the beam focuses on the array to be tested.

In brief, this invention provides a method of analyzing the correctness of a DRAM redundancy repair. The method is capable of showing whether the circuit is the correct design and validating the correctness of the coordinates of a defective location so that production time is saved and the manufacturing steps as well as production cost is reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 4A is a diagram showing the location of array and redundancy element after the defective array in FIG. 3A is repaired;

FIG. 4B is a physical bit map derived from an effective array after a redundancy repair by illumination as shown in FIG. 4A; and FIG. 4C is a physical bit map derived from a redundancy array for repairing a defective redundancy array by illumination as shown in FIG. 4A.

DESCRIPTION OF THE PREFERRED EMBODIMENTS

Figure 1A:
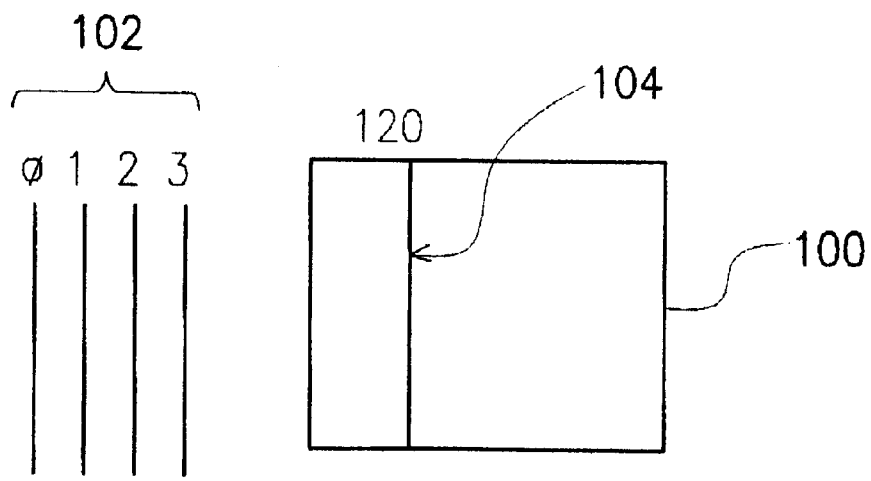
FIG. 1A is a schematic diagram showing an array with redundant elements within a conventional dynamic random access memory die.
Figure 1B:
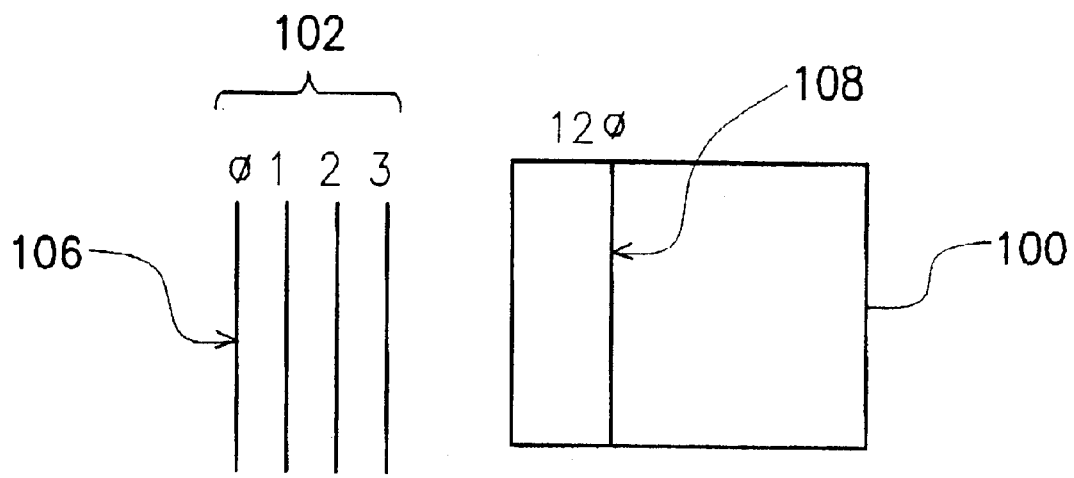
FIG. 1B is a schematic diagram showing the array in FIG. 1A after a redundancy repair operation.

Reference will now be made in detail to the present preferred embodiments of the invention, examples of which are illustrated in the accompanying drawings. Wherever possible, the same reference numbers are used in the drawings and the description to refer to the same or like parts.

Figure 2:
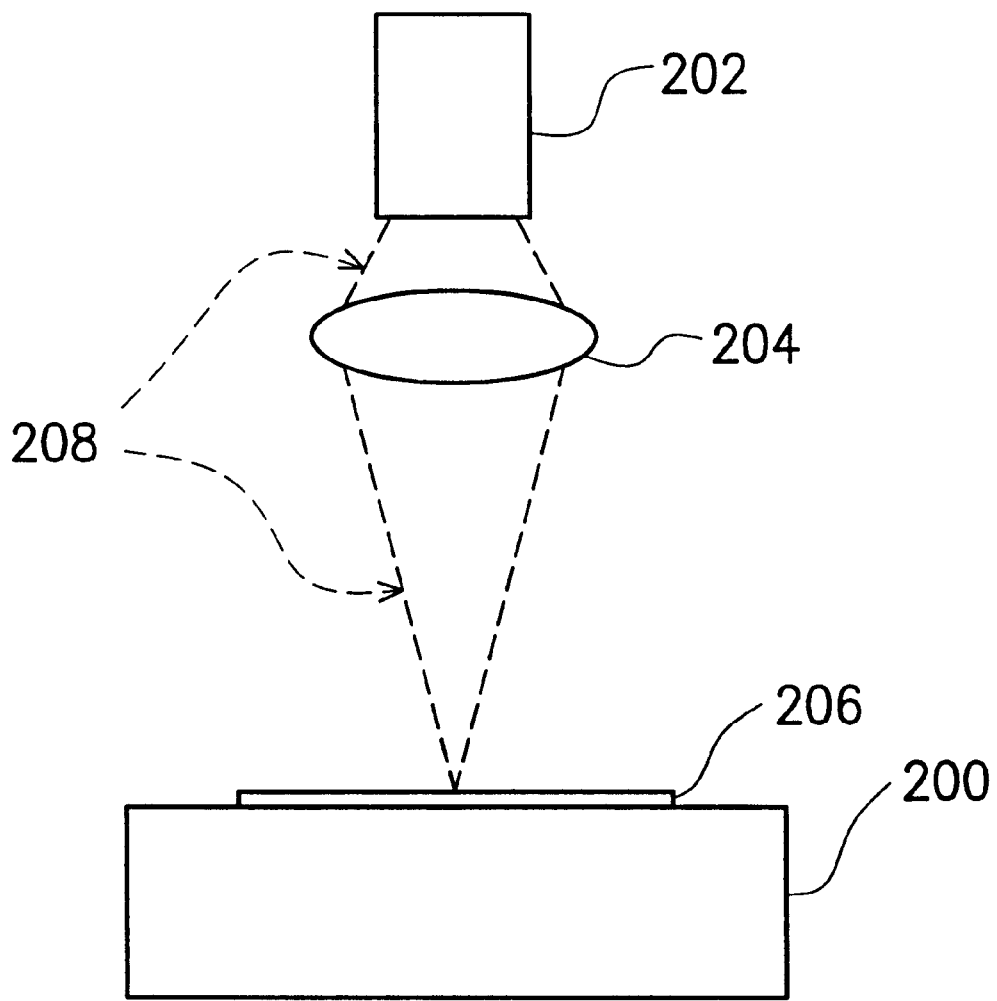
FIG. 2 is a schematic diagram showing a device for determining the correctness of a DRAM redundancy repair according to one preferred embodiment of this invention.

FIG. 2 is a schematic diagram showing a device for determining the correctness of a DRAM redundancy repair according to one preferred embodiment of this invention. As shown in FIG. 2, the device includes an automatic pin probe 200, a light source 202 and a convex lens 204. A wafer 206 to be tested is placed on the automatic pin probe 200 with the light source 202 positioned directly above. Utilizing the convex lens 204 between the light source 202 and the automatic pin probe 200, a beam of laser emitting from the light source 202 is focused on the wafer 206 aligning with an array portion of the die to be tested.

Figure 3A:
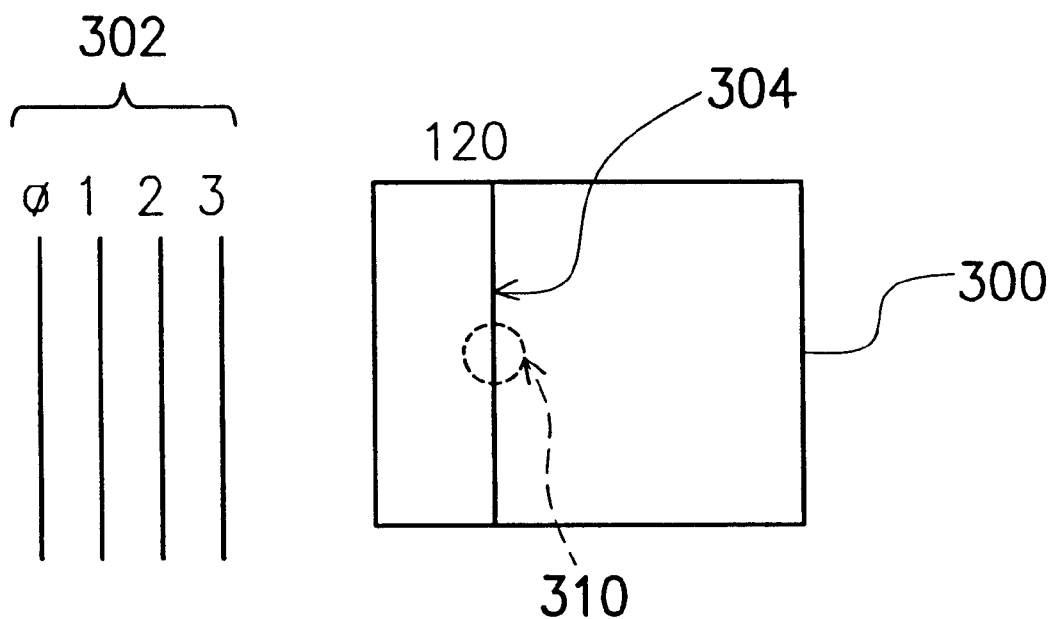
FIG. 3A is a diagram showing the location of an array and a redundancy element within a DRAM die according to one preferred embodiment of this invention.

FIG. 3A is a diagram showing the location of an array and a redundancy element within a DRAM die according to one preferred embodiment of this invention. As shown in FIG. 3A, the DRAM die includes a normal array 300 and a redundancy element 302. The so-called 'redundancy element' 302 refers to a plurality of extra rows or columns produced on the die. In this embodiment, the redundancy elements 302 are columns in the array.

This invention utilizes the characteristics of a DRAM cell to validate correctness of a redundancy repair. The so-called characteristics of a DRAM device refers to the utilization of the convex lens 204 between the automatic pin probe 200 and the light source 202 to focus a convergent light beam 208 from the light source 202 onto one portion of the wafer 206 (as shown in FIG. 2). The convergent light beam 208 is focused at a small portion of the array 300 within the die as a small point.

When a particular DRAM cell is illuminated by the spot of light, leakage is intensified and a stored data bit within the DRAM cell having the value '1' is converted to a stored data '0' after some time. This is the so-called refresh time. Utilizing the refresh time test to fail the illuminated array element and to pass the non-illuminated array element, a physical bit map can be projected onto a computer screen.

As shown in FIG. 3A, a defective array (array 120) 304 appears in the array 300. A convergent light beam produced by the pin probe aims at a point 310 on the defective array (array 120) 304. The resulting physical bit map after the illumination is shown in FIG. 3B.

Figure 3B:
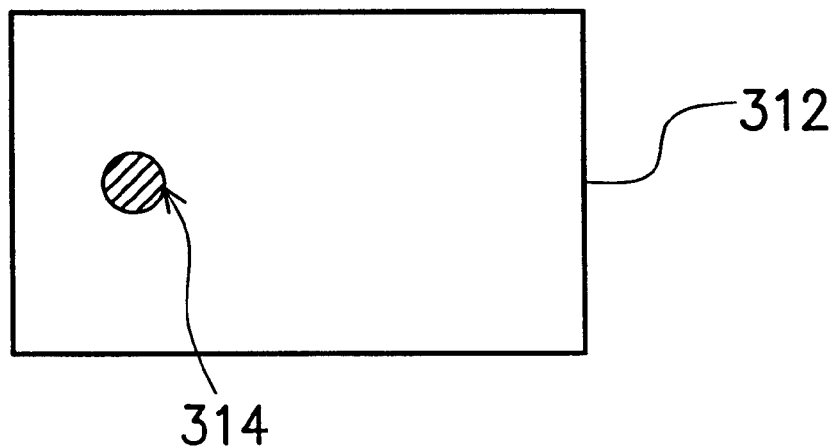
FIG. 3B is a physical bit map after the defective array in FIG. 3A is illuminated with a light beam.

FIG. 3B is a physical bit map after the defective array in FIG. 3A is illuminated with a light beam. As shown in FIG. 3B, the screen 312 corresponds with the defective array 310 on the die (shown in FIG. 3A) having a spot image 314. The spot image 314 represents the position of the defective array 310. Thereafter, the steps necessary for a redundancy repair are carried out. The method of analyzing the correctness of a DRAM redundancy repair is further explained with reference to FIGS. 4A to 4C.

FIG. 4A is a diagram showing the location of array and redundancy element after the defective array in FIG. 3A is repaired. As shown in FIG. 4A, when a defective array (array 120) 304 appears in the array 300 (as shown in FIG. 3A), a specific program is used to find the location of the design defect before conducting a redundancy repair. In other words, an array (redundancy Ø) 306 within the redundancy elements 302 replaces the defective array 304 such that the defective array (array 120) 304 within the normal array 300 is transformed into an active array (array 12Ø) 308.

To determine if the redundancy repair is correct or not, a convergent light beam from the pin probe (shown in FIG. 2) aims at a spot 316 on the active array (array 12Ø) 308 so that location of the defective array 304 already repaired is found. The physical bit map on a screen after illumination is shown in FIG. 4B.

FIG. 4B is a physical bit map derived from an effective array after a redundancy repair by illumination as shown in FIG. 4A. As shown in FIG. 4B, when a convergent light beam from the pin probe (shown in FIG. 2) aims at a spot 316 (shown in FIG. 4A) on the active array (array 12Ø) 308, a circular shaped image having a seemingly central cut will appear on a screen 312 in a position corresponding to the active array 308 of the die. In other words, a pair of semi-circular shaped images will appear on the screen 312. These two semi-circular images 320 represent the location of the defective array having the redundancy repair. Since the active array 308 is actually replaced by the redundancy array, the portion illuminated by the convergent light beam belongs to an inactive array. However, the image alone cannot conclude that the redundancy repair is correct. Hence, detected images as shown in FIG. 4C must be used as a comparison.

Thereafter, the convergent light beam aims at the redundancy elements 302, the spot 318 for repairing the defective array 304 using the array (redundancy Ø) 306. Hence, the correctness of repair of the defective array 304 by the redundancy array (redundancy Ø) 306 can be determined. The physical bit map on a screen after illumination is shown in FIG. 4C.

FIG. 4C is a physical bit map derived from a redundancy array for repairing a defective redundancy array by illumination as shown in FIG. 4A. As shown in FIG. 4C, when a convergent light beam aims at the spot 318 (shown in FIG. 4A) for repairing the defective array 304 (shown in FIG. 3A) by the array (redundancy Ø) 306, a linear image 322 is produced. This linear image 322 represents the location repaired by the redundancy array 306. If the linear image 322 is located exactly in the middle of the two semicircular shaped images 320 (shown in FIG. 3B), the illuminated array (redundancy Ø) 306 is the array that replaces the defective array 304 (shown in FIG. 3A) and produces an active array (array 12Ø) 308. Hence, a proper redundancy repair has been carried out. Conversely, if the linear image 322 is not formed in a location between the two semicircular shaped images 320, the illuminated array (redundancy Ø) 306 is not the redundancy array that replaces the defective array 304 (shown in FIG. 3A). Therefore, an incorrect redundancy repair has been conducted.

In conclusion, major aspects of this invention includes:

1. This invention is capable of determining if a particular circuit design is correct and validating the correctness of defect coordinates.
2. Illuminating the array on a die as a check for the correctness of redundancy repair simplifies production and saves production time.
3. Illuminating the array on a die as a check for the correctness of redundancy repair reduces production costs, by not conducting a conventional test mode that increases area occupation of the die.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of determining the correctness of a redundancy repair so that proper replacement of a defective array on a die by a redundancy array can be validated, comprising the steps of:

illuminating the defective array with a convergent light beam;

observing a physical bit map of the defective array in the form of two semicircular shaped images so that the corresponding position of the defective array is determined;

illuminating the redundancy array on the die with a convergent light beam; and validating the correct replacement of the defective array by the redundancy array according to the location of the physical bit map of the redundancy array having a linear shape, wherein if the linear shaped physical bit map of the redundancy array is located between the two semicircular shaped physical bit map images of the defective array, proper replacement of the defective array by the redundancy array is validated; and if the linear shaped physical bit map of the redundancy array is not between the two semicircular shaped physical bit map images of the defective array, the defective array is improperly replaced by the redundancy array.

2. The method of claim 1, wherein the redundancy array includes rows in a die.

3. The method of claim 1, wherein the redundancy array includes columns in a die.

* * * * *